(12) United States Patent
Chern et al.

(10) Patent No.: US 6,448,628 B2
(45) Date of Patent: *Sep. 10, 2002

(54) CHIP DECOUPLING CAPACITOR

(75) Inventors: Wen-Foo Chern; Ward D. Parkinson; Thomas M. Trent; Kevin G. Duesman, all of Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/492,932

(22) Filed: Jan. 27, 2000

Related U.S. Application Data

(63) Continuation of application No. 08/916,184, filed on Aug. 21, 1997, now Pat. No. 6,124,625, which is a continuation of application No. 08/655,286, filed on May 15, 1996, now abandoned, which is a continuation of application No. 08/341,320, filed on Nov. 17, 1994, now abandoned, which is a continuation of application No. 08/100,631, filed on Jul. 29, 1993, now abandoned, which is a continuation of application No. 07/970,528, filed on Nov. 2, 1992, now Pat. No. 5,266,821, which is a continuation of application No. 07/703,235, filed on May 20, 1991, now abandoned, which is a continuation-in-part of application No. 07/529,679, filed on May 28, 1990, now abandoned, which is a continuation of application No. 07/200,673, filed on May 31, 1988, now abandoned.

(51) Int. Cl.[7] .................. H01L 29/00; H01L 27/108; H01L 29/93
(52) U.S. Cl. ............... 257/532; 257/312; 257/596
(58) Field of Search .................. 257/532, 202, 257/204, 205; 307/297

(56) References Cited

U.S. PATENT DOCUMENTS

| | | | |
|---|---|---|---|
| 3,460,010 A | 8/1969 | Domenico et al. | |
| 3,538,397 A | 11/1970 | Davis | |

(List continued on next page.)

FOREIGN PATENT DOCUMENTS

| | | | |
|---|---|---|---|
| JP | 56-15065 | | 2/1981 |
| JP | 56-123800 | * | 9/1981 |
| JP | 58-64048 | | 4/1983 |
| JP | 58-640048 | | 4/1983 |
| JP | 58-77251 | | 5/1983 |
| JP | 61-73367 | * | 4/1986 |

OTHER PUBLICATIONS

IBM technical bulletin, vol. 31, No. 8 (Jan. 1989), pp. 381–382.*

"On–Chip Decoupling Capacitors for VLSI Gate Array and Master Image Products", IBM Technical Bulletin vol. 31, No. 8 (Jan. 1989), pp. 381–382.

Riezman, Michael, "Wanlass's CMOS Circuit", IEEE Spectrum, vol. 28, No. 5 (May 1991), p. 44.

Full English Translation of Matsumoto, Japan Kokai 61–73367 (Apr. 5, 1986), pp. 1–24.

Primary Examiner—Tom Thomas
Assistant Examiner—Ori Nadav
(74) Attorney, Agent, or Firm—O'Keefe, Egan & Peterman, LLP

(57) ABSTRACT

An extensive network of N-channel transistor formed capacitor, with one node tie directly to $V_{CC}$ power bus and the other node directly $V_{SS}$ power bus, is implemented throughout all open space available on the whole silicon chip (memory as well as logic chip), particularly those directly underneath the metal power bus to achieve an on-chip power bus decoupling capacitor with capacitance in excess of 0.001 µF.

15 Claims, 5 Drawing Sheets

U.S. PATENT DOCUMENTS

| | | |
|---|---|---|
| 3,769,106 A | 10/1973 | Chen et al. |
| 3,772,097 A | 11/1973 | Davis |
| 4,164,751 A | 8/1979 | Tasch, Jr. |
| 4,266,282 A | 5/1981 | Henle et al. |
| 4,317,686 A | 3/1982 | Anand et al. |
| 4,349,862 A | 9/1982 | Bajorek et al. |
| 4,423,431 A | 12/1983 | Sasaki |
| 4,477,736 A * | 10/1984 | Onishi ................. 307/297 |
| 4,493,056 A | 1/1985 | Mao |
| 4,567,542 A | 1/1986 | Shimada et al. |
| 4,577,214 A | 3/1986 | Schaper |
| 4,604,639 A | 8/1986 | Kinoshita |
| 4,605,980 A | 8/1986 | Hartnranft et al. |
| 4,634,894 A * | 1/1987 | Shu et al. ............. 307/297 |
| 4,641,425 A | 2/1987 | Dubuission et al. |
| 4,654,690 A | 3/1987 | Okada et al. |
| 4,656,605 A | 4/1987 | Clayton |
| 4,691,304 A | 9/1987 | Hori et al. |
| 4,720,737 A | 1/1988 | Shirato |
| 4,737,830 A | 4/1988 | Patel et al. |
| 4,745,084 A | 5/1988 | Rowson et al. |
| 4,777,518 A | 10/1988 | Mihara et al. |
| 4,780,846 A | 10/1988 | Tanabe et al. |
| 4,835,416 A | 5/1989 | Miller |
| 4,937,649 A | 6/1990 | Shiba et al. |
| 5,032,892 A | 7/1991 | Chern et al. |
| 5,266,821 A | 11/1993 | Chern et al. |
| 5,307,309 A | 4/1994 | Protigal et al. |
| 5,404,042 A | 4/1995 | Okumura et al. |

\* cited by examiner

CHIP DECOUPLING CAPACITOR

CROSS-REFERENCE TO RELATED APPLICATIONS

This application is a continuation of Ser. No. 08/916,184 filed Aug. 21, 1997, (now U.S. Pat. No. 6,124,625) which is a continuation of Ser. No. 08/655,286 filed May 15, 1996 now abandoned, which is a continuation of Ser. No. 08/341,320 filed Nov. 17, 1994 now abandoned which is a continuation of Ser. No. 08/100,631 filed Jul. 29, 1993 now abandoned, which is a continuation of Ser. No. 07/970,528 filed Nov. 2, 1992 (now U.S. Pat. No. 5,266,821), which is a continuation of Ser. No. 07/703,235 filed May 20, 1991 now abandoned, which is a CIP of Ser. No. 07/529,679 filed May 28, 1990 (Abandoned), which is a continuation of Ser. No. 07/200,673 filed May 31, 1988 now abandoned.

FIELD OF THE INVENTION

This invention relates to semiconductor devices, and more specifically to circuit connections on semiconductor devices and to the reduction of voltage transients on the semiconductor devices.

BACKGROUND OF THE INVENTION

Semiconductor circuit devices, including integrated circuit devices such as DRAMS and SRAMS, switch internal leads and output drivers on and off as a part of their operation.

Such semiconductor devices typically take the form of a semiconductor die. The die is generally attached to a lead frame within a package, by means of fine gold wires, as shown in FIG. 1. These fine gold wires function as lead frame connection wires. The lead frame and die is then encapsulated, in the form of the familiar integrated circuit "chip". The packaged chip is then able to be installed on a circuit board by any number of techniques, such as socketing and soldering.

The gold connection wires, because of their length relative to their diameter, function as inductors. As current through the gold connection wires is alternately switched on or off, voltage spikes occur. In order to reduce the effects of voltage transients, external capacitors have been installed either within the semiconductor package or on a circuit board onto which the semiconductor packages are installed. In either case, the capacitor is on an opposite side of the lead frame connection wire from the semiconductor die. This establishes the circuit shown in FIG. 2. This equivalent circuit represents an inappropriate arrangement for filtering voltage transients from affecting the box, which represents the semiconductor. Therefore, it is desirable to provide capacitance on the other side of the inductor, i.e., the side of the inductor that the device is connected to.

Most semiconductors, including all DRAMS, include capacitors. For example, a 4 Meg DRAM includes over 4 million capacitors each. For the purpose of storing individual bits of information, these capacitors are accessed by connections through access transistors and sense amps, connected through a periphery circuit. The present invention concerns adding filter capacitance to such devices in order to provide protection from voltage transients which may not be afforded by what may be millions of other capacitors on the semiconductor device.

Semiconductor circuit devices are designed with an architecture which places their functional circuitry within a confined area, usually rectangularly shaped. At the perimeter (either outside or inside) of the rectangularly shaped area are a series of contact pads and a substantial amount of chip area which is occupied by conductor busses, but is unoccupied by active circuit devices. Unlike many of the circuit elements on a semiconductor circuit device, filter capacitors need not be built to precise specifications. It is therefore, possible to utilize perimeter areas and portions of semiconductor chip area which form major border areas between active portions of the semiconductor circuit device.

There is a significant advantage in providing that any added circuit elements be on the same side of a chip wafer as other circuit elements, because of manufacturing techniques and tolerances. Conventionally, semiconductor circuit devices are arrayed on one side of a die wafer. It would therefore be advantageous to design a filtering element which would not significantly expand the die area (chip area) required for each die.

There is a certain portion of the die area which is not particularly suitable for active circuitry. This includes chip area occupied by bus lines, which are normally metallization which overlays most or all of the patterned layers which make up the active circuitry on the die.

SUMMARY OF THE INVENTION

In accordance with the present invention, a semiconductor circuit device is formed in which border areas, including perimeter border areas and intermediate border areas, are capacitors. The filter capacitors are in electrical communication with lead frame connection pads, to which the lead frame connection wires are attached. This establishes a filter capacitance in excess of 0.001 $\mu$F on the semiconductor device side of the lead frame connection wires, thereby filtering voltage transients which may be generated by the lead frame connection wires.

The capacitor may be a depletion mode capacitor occupying a space defined by a plurality of conductive lines, such as the bus lines. One of these conductive lines may be connected, as a regulated conductive line, to a voltage regulating circuit.

DETAILED DESCRIPTION OF THE PREFERRED EMBODIMENTS

Figure 1:
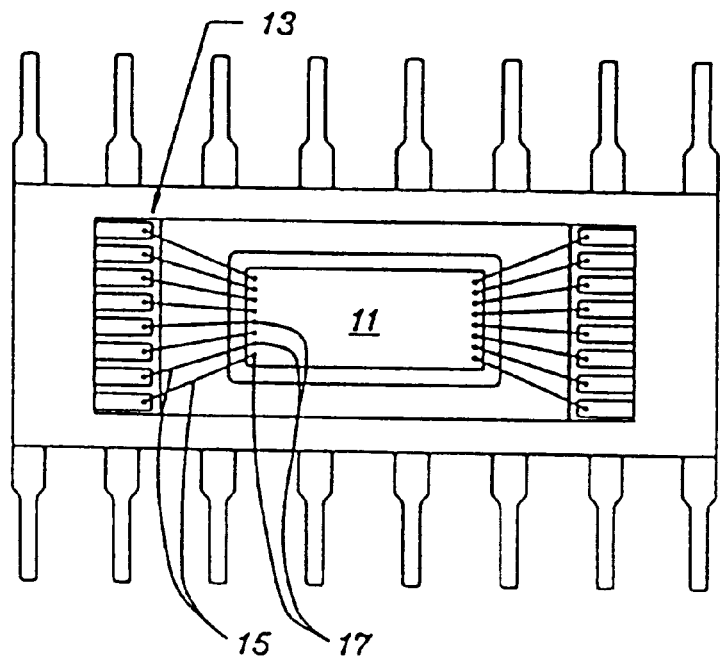
FIG. 1 shows a top view of a semiconductor device attached by pads to the lead frame.
Figure 2:
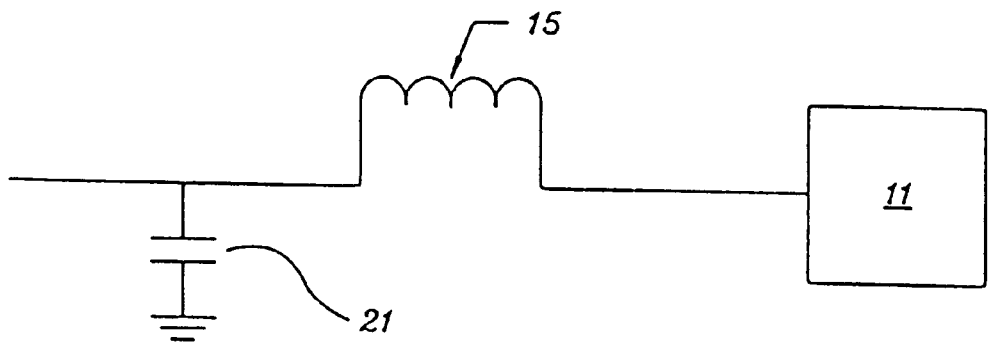
FIG. 2 shows an equivalent circuit of a semiconductor device connected to a lead wire and an off-chip capacitor.
Figure 3:
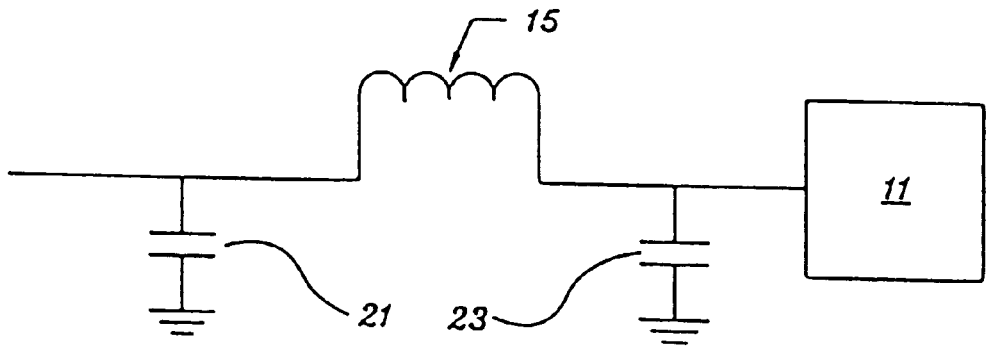
FIG. 3 shows an equivalent circuit of a semiconductor circuit device connected through a lead frame connection wire and having an on-chip decoupling capacitor.

Referring to FIG. 1, a semiconductor device includes a die 11 which is connected to a leadframe 13 by a priority of lead wires 15. The lead wires 15 are attached to the die 11 at pads or contact points 17. The lead wires 15 function as inductors, as schematically shown in FIGS. 2 and 3. While an external capacitor 21 is often provided, appropriate filter capacitance would be located on the die side of the lead wire 15, as schematically shown in FIG. 3 at 23.

Figure 4:
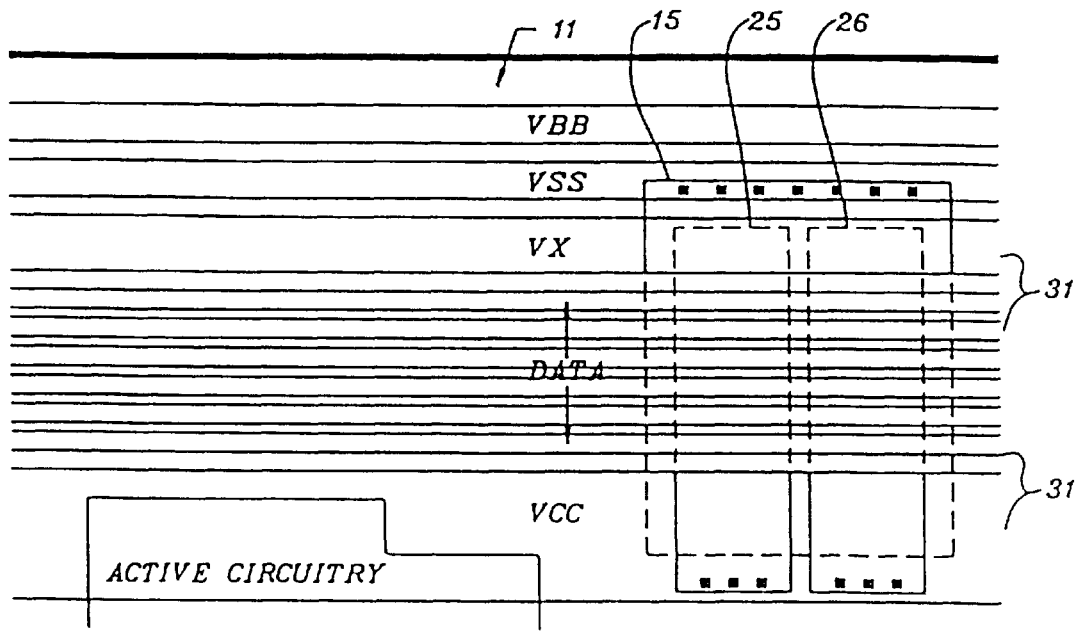
FIG. 4 shows a top view of a semiconductor, which incorporates a decoupling capacitor.

FIG. 4 shows details of one end of the die 11 constructed with the present invention, a pair of capacitors are defined by an active area of the substrate 15 and a polysilicon (poly) layer which is formed into strips 25, 26. The active area 15 is in electrical communication with a first bus line $V_{SS}$. The poly strips 25, 26 are in electrical communication with a second bus line $V_{CC}$. Oxide is used to separate the Poly 25, 26 from the active area 15.

The capacitors defined by the strips 25, 26 are on a location of the circuit die 11 which underlies $V_X$ and $V_{CC}$, as well as other buses 31. The buses 31 (including $V_X$ and $V_{CC}$) are typically metallization layers, and real estate occupied by the buses 31 cannot be used for most active circuitry. This is because active circuitry requires utilization of layers as outputs, which in this case is prevented by the buses 31 which are used for routing signals from the left end to the right end of the chip.

Figure 5:
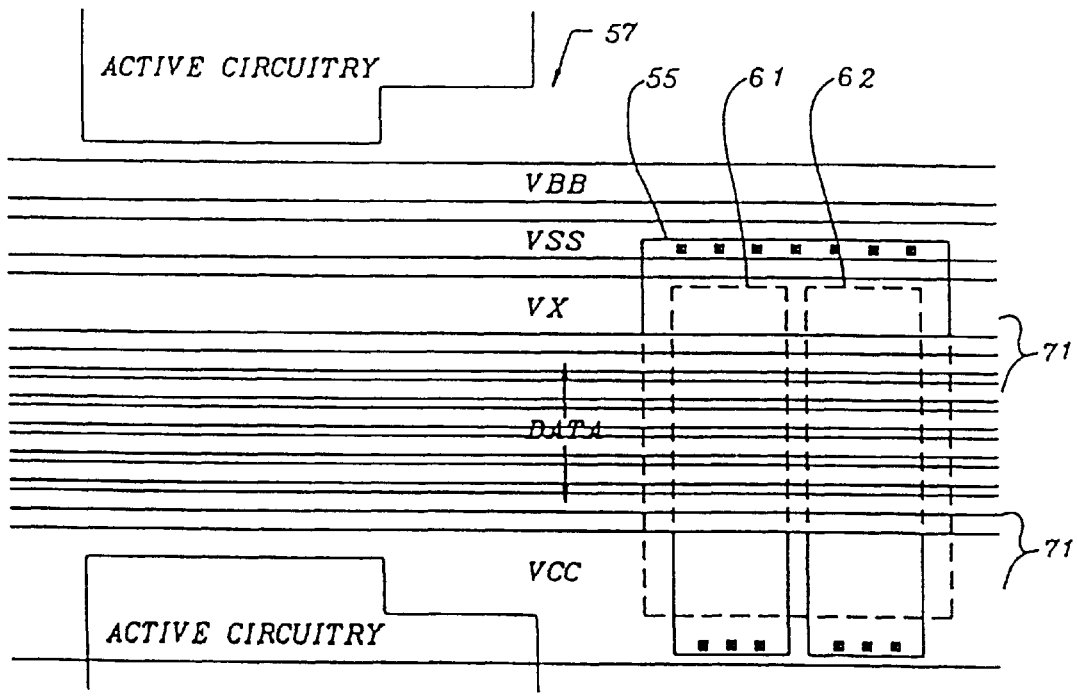
FIG. 5 shows a top view of a semiconductor device, in which a decoupling capacitor is placed along an intermediate boundary area of the chip architecture.

FIG. 5 shows a configuration in which a pair of capacitors are defined by an active substrate area 55 along an intermediate portion of a semiconductor die 57. A plurality of poly strips 61–62, superimposed over the active poly area define a plurality of capacitors. Circuit buses 71 are superimposed over the capacitors 61–62, so that the capacitors 61–62 do not occupy real estate that could be used for most active circuit devices.

The invention has been described in terms of connection to circuit busses which have external connections. It is possible that an additional circuit may be placed between the bus and an external connection. A likely example of such an additional circuit would a voltage regulating circuit. It is possible to connect the capacitor to a bus which extends between such an additional circuit and a main portion of the integrated circuit device.

Figure 6:
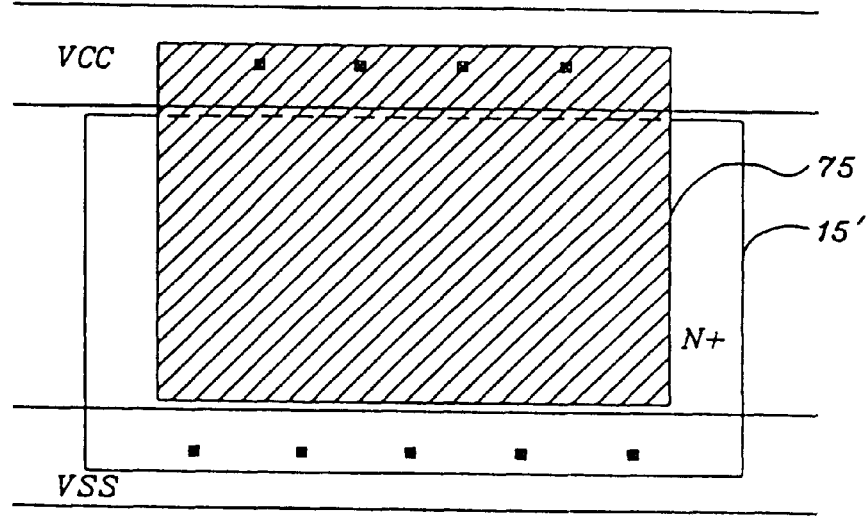
FIGS. 6 and 7 show connection arrangements for N-channel and P-channel capacitor, respectively.
Figure 7:
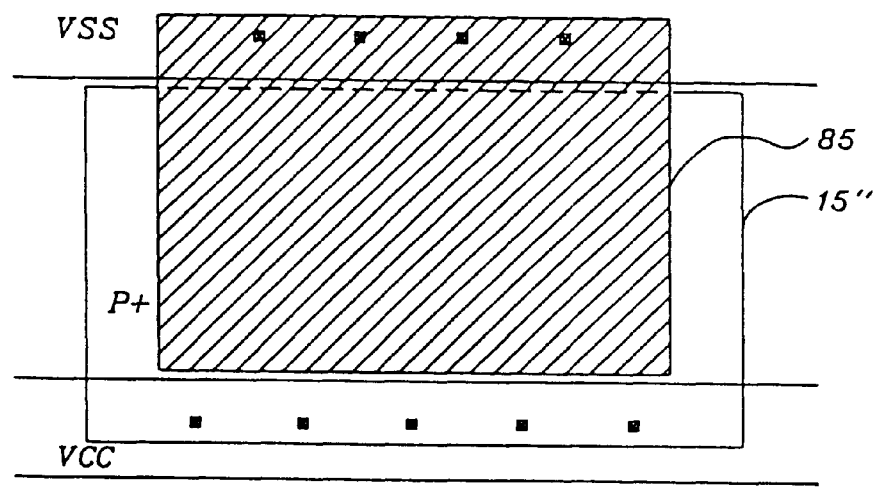
Figure 8:
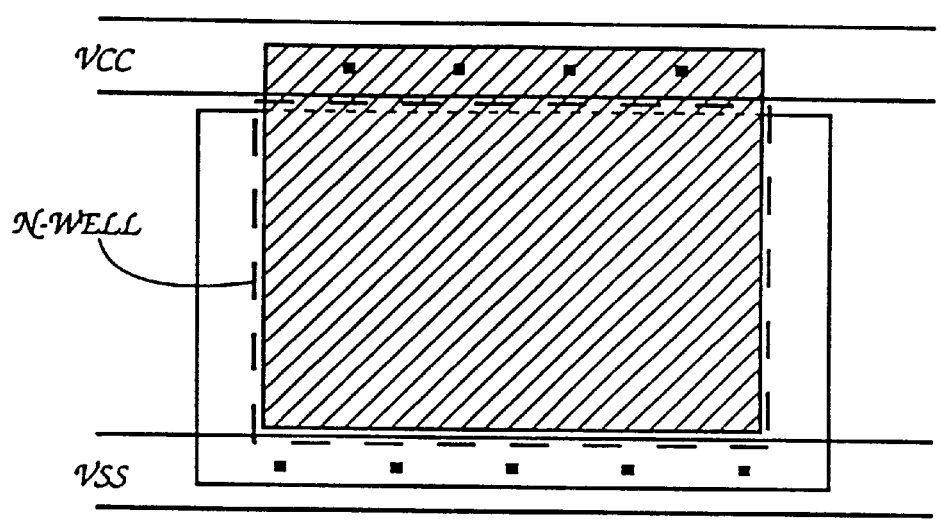
FIGS. 8 and 9 show arrangements for depletion mode capacitors.
Figure 9:
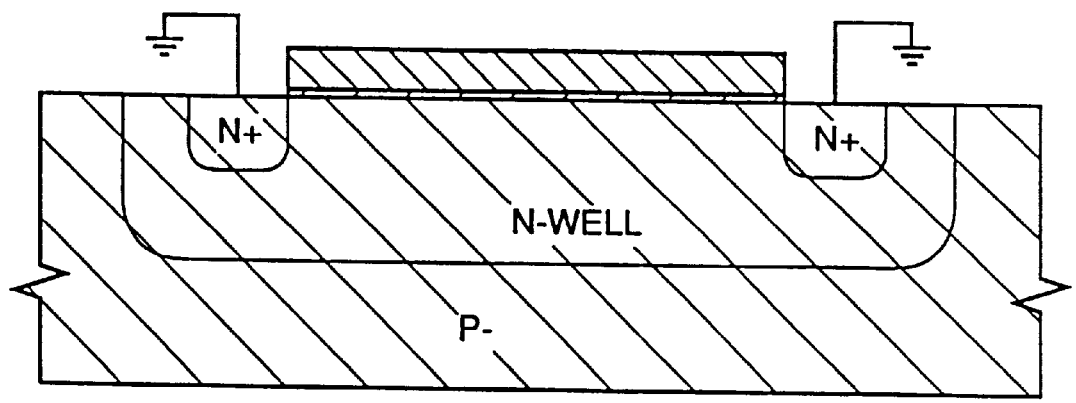

The present embodiment contemplates the use of N channel capacitors, with $V_{SS}$ connected to active area 15' and $V_{CC}$ connected to poly 75. This is shown in FIG. 6. It is possible to construct P channel capacitors, with $V_{CC}$ connected to active area 15" and $V_{SS}$ connected to poly 85. This is shown in FIG. 7. In one embodiment, each of these is an enhancement mode capacitor, which has a preferential voltage polarity. In an alternate embodiment, shown in FIGS. 8 and 9, they may be depletion mode capacitors, which have less preferential voltage polarity. Depletion mode capacitors are defined by an active area of the substrate and a polysilicon layer.

Figure 10:
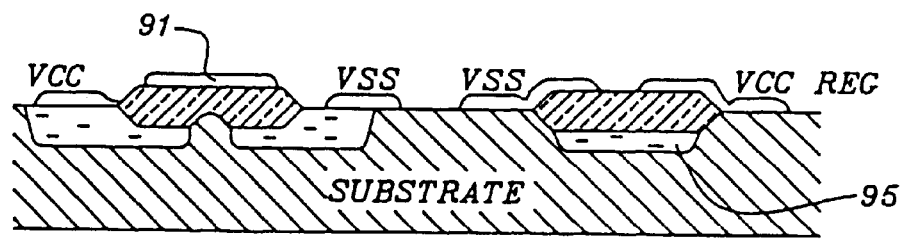
FIG. 10 shows a cross-sectional view of an arrangement in which two capacitors are connected in series in order to increase breakdown voltage.

It may also be the case that two capacitors may be connected in series in order to increase the total breakthrough voltage of the combined capacitors. Enhancement mode capacitors require adjustment for their preferential voltage polarity. This can be accomplished through interconnects or similar means. Depletion mode capacitors, on the other hand, have less preferential voltage polarity. If the capacitors are not polarization sensitive, then the capacitors can have a common poly plate 91 or a common active area 95, as schematically shown in FIG. 10.

Figure 11:
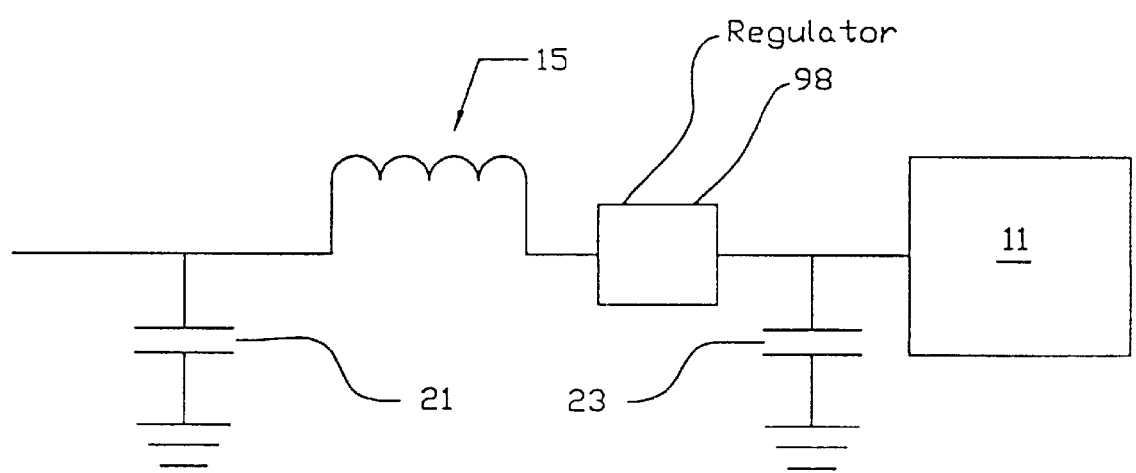
FIG. 11 shows a schematic block diagram representation of semiconductor circuit device having an on-chip regulator.

Referring to FIG. 11, a regulator 98 is on-chip with capacitor 23 and die 11.

What is claimed is:

1. A semiconductor memory storage device comprising:
   a semiconductor substrate of a first conductivity type;
   a plurality of active circuit devices on the semiconductor substrate;
   a voltage regulator circuit;
   a power bus for carrying a regulated power supply voltage from the voltage regulator circuit to at least some of the plurality of active circuit devices; and
   a capacitor within the substrate, the capacitor including a dielectric sandwiched between a channel of a second conductivity type different than the first and a conductive layer, the channel formed in a region of the second conductivity type, the capacitor also including at least two heavily doped regions that are of the second conductivity type located at opposing termination ends of the conductive layer, and wherein the conductive layer is included in a first node to which a first electrical potential is applied, and the two heavily doped regions are included in a second node to which a substantially different second electrical potential is applied to provide filtering capacitance to the semiconductor device,
   wherein one of the first or second electrical potentials is the regulated power supply voltage.

2. The device of claim 1, wherein the first conductivity type is a P type and the second conductivity type is an N type.

3. The device of claim 1, wherein the conductive layer is a polysilicon layer.

4. The device of claim 1, wherein the capacitor has a capacitance in excess of 0.001 microfarad.

5. The device of claim 1, wherein the capacitor is a first capacitor, and further comprising a second capacitor having a conductive layer, and wherein the conductive layer of the first capacitor is common with the conductive layer of the second capacitor.

6. The device of claim 1, wherein the device is a dynamic random access memory (DRAM).

7. The device of claim 1, wherein the first electrical potential is the regulated power supply voltage, and the second electrical potential is a ground signal.

8. A semiconductor memory storage device comprising:
   a semiconductor substrate of a first conductivity type;
   a plurality of active circuit devices on the semiconductor substrate;
   a voltage regulator circuit;
   a power bus for carrying a regulated power supply voltage from the voltage regulator circuit to at least some of the plurality of active circuit devices; and
   a depletion mode capacitor including a channel of a second conductivity type different than the first, the channel formed in a region of the second conductivity type, a conductive layer, a dielectric sandwiched between the channel and the conductive layer, and at least two heavily doped regions that are of the second conductivity type and are located at opposing termination ends of the conductive layer, and wherein the conductive layer is included in a first node to which a first signal having a first electrical potential is applied, and the heavily doped regions included in a second node to which a second signal having a substantially different second electrical potential is applied to provide filtering capacitance to the semiconductor device,
   wherein one of the first or second electrical potentials is the regulated power supply voltage.

9. The device of claim 8, wherein the capacitor is a first capacitor and further comprising a second capacitor having a conductive layer and wherein the conductive layer of the first capacitor is common with the conductive layer of the second capacitor.

10. A semiconductor device comprising:

a p-type semiconductor substrate;

a plurality of active circuit devices fabricated on the substrate;

a voltage regulator circuit;

a regulated supply voltage bus and a reference voltage bus both located on the substrate in an area thereof unoccupied by any of the active circuit devices, the regulator supply voltage bus coupled to the voltage regulator circuit; and a decoupling capacitor fabricated on the substrate proximate the area of the supply voltage and reference voltage busses, the capacitor comprising:

a poly layer operatively coupled to one of the regulated supply voltage and reference voltage busses;

an n-channel;

an oxide layer located between the poly layer and the n-channel; and two heavily doped n+ regions situated at opposing terminating ends of the poly layer, the heavily doped n+ regions being operatively coupled to the other of the regulated supply voltage and reference voltage busses.

11. A semiconductor device comprising:

a substrate;

a plurality of active circuit devices fabricated on the substrate in a periphery circuit area;

a plurality of memory storage bit locations coupled to the active circuit devices;

a voltage regulator circuit;

a first voltage bus for conducting a regulated voltage from the voltage regulator circuit and a second voltage bus for conducting a second voltage different than the regulated voltage, both busses being located on the substrate in an area thereof unoccupied by any of the active circuit devices; and a decoupling capacitor fabricated on the substrate proximate the area of the busses, the capacitor comprising:

a conductive layer operatively coupled to one of the first and second voltage busses;

a channel having one of a p-type or an n-type conductivity;

a dielectric layer located between the conductive layer and the channel; and two relatively heavily doped regions having the same type of conductivity as the channel and being situated at opposing terminating ends of the poly layer, the heavily doped regions being operatively coupled to the other of the first and second voltage busses.

12. The semiconductor device of claim 11 wherein the regulated voltage comprises a supply voltage and the second voltage comprises a reference voltage, wherein the heavily doped regions are operatively coupled to the first voltage bus and the conductive layer is operatively coupled to the second voltage bus.

13. The semiconductor device of claim 11 wherein the channel has n-type conductivity, wherein the heavily doped regions have $n^+$ type conductivity.

14. A semiconductor memory storage device comprising:

a substrate;

a plurality of active circuit devices fabricated on the substrate;

a voltage regulator circuit;

a first voltage bus for conducting a regulated bus and a second voltage bus for conducting a second voltage different than the regulated voltage, both busses being located on the substrate in an area thereof unoccupied by any of the active circuit devices; and a depletion mode decoupling capacitor fabricated on the substrate proximate the area of the busses, the capacitor comprising:

a conductive node operatively coupled to one of the regulated and second voltage busses;

a conductive path having one of a p-type or an n-type conductivity;

a dielectric for isolating the conductive node from the conductive path; and two relatively heavily doped regions having the same type of conductivity as the conductive path and being in contact with the conductive path at two opposing terminating ends of the conductive node, the region being operatively coupled to the other of the regulated and second voltage busses.

15. The semiconductor memory storage device of claim 13 wherein the conductive node comprises a conductive layer, wherein the conductive path comprises a channel, and wherein the dielectric comprises a dielectric layer.

* * * * *

UNITED STATES PATENT AND TRADEMARK OFFICE
CERTIFICATE OF CORRECTION

PATENT NO.    : 6,448,628 B2
DATED         : September 10, 2002
INVENTOR(S)   : Chern et al.

It is certified that error appears in the above-identified patent and that said Letters Patent is hereby corrected as shown below:

Column 4,
Line 13, after "located" insert -- in said region --.
Line 17, after "node" delete "to which" and insert -- wherein --.
Line 18, delete "applied" and insert -- making contact to both the two heavily doped regions --.
Line 53, after "located" insert -- in said region --.
Line 58, delete "to which" and insert -- wherein --.
Line 59, delete "applied" and insert -- making contact to both the two heavily doped regions --.

Column 5,
Line 18, after "an n-channel" insert -- the n-channel formed in an n-region --.
Line 21, after "situated" insert -- in said n-region --.
Line 23, after "layer, the" insert -- two --.
Line 24, after "regions", delete "being operatively coupled" and insert -- making contact --.
Line 45, after "conductivity" insert -- , said channel formed in a region of the same conductivity type as that of the channel --.

UNITED STATES PATENT AND TRADEMARK OFFICE
CERTIFICATE OF CORRECTION

PATENT NO. : 6,448,628 B2
DATED : September 10, 2002
INVENTOR(S) : Chern et al.

It is certified that error appears in the above-identified patent and that said Letters Patent is hereby corrected as shown below:

Column 6,
Line 3, before "at opposing", insert -- in said region --.
Line 4, before "heavily", insert -- two --.
Line 4, after "regions", delete "being operatively coupled" and insert
-- making contact --.
Line 31, after "conductivity" insert -- , said conductive path formed in a region of the same conductivity type as that of said conductive path --.
Line 36, after "path" insert -- in said region --.
Line 37, delete "region being operatively coupled" and insert -- two relatively heavily doped regions making contact --.

Signed and Sealed this

Third Day of December, 2002

JAMES E. ROGAN
*Director of the United States Patent and Trademark Office*